US005979590A

United States Patent [19]

Telmos

[11] Patent Number: 5,979,590

[45] Date of Patent: Nov. 9, 1999

[54] SOUND BAR ASSEMBLY FOR MOTOR VEHICLES

[75] Inventor: Robert J. Telmos, Rochester Hills, Mich.

[73] Assignee: Top Source Automotive, Inc., Troy, Mich.

[21] Appl. No.: 09/063,132

[22] Filed: Apr. 20, 1998

[51] Int. Cl.[6] .................................................... H05K 5/00

[52] U.S. Cl. .......................................... 181/141; 181/150

[58] Field of Search .................................. 181/141, 150, 181/144, 148, 145; 381/86

[56] References Cited

U.S. PATENT DOCUMENTS

| | | |
|---|---|---|
| 4,005,761 | 2/1977 | Okamoto et al. . |
| 4,056,165 | 11/1977 | Okamoto et al. . |
| 4,099,026 | 7/1978 | Persson et al. . |
| 4,493,389 | 1/1985 | Del Rosario . |
| 4,673,056 | 6/1987 | Koppelomaki . |
| 5,094,316 | 3/1992 | Rosen .................................... 181/141 |
| 5,646,381 | 7/1997 | Boyte Jr. ............................... 181/141 |

*Primary Examiner*—Khanh Dang

*Attorney, Agent, or Firm*—Dykema Gossett PLLC

[57] ABSTRACT

A sound bar assembly 12 for converting electronic signals into sound within a vehicle can be located at the rear edge 18 of the roof 16 of a sport utility vehicle 10. The sound bar is made of a lower member 20 and an upper member 22 that preferably are made of polymeric materials capable of forming a sealed relationship with each other without the need for gasketing material. The sound bar has a wedge shape and speakers 32 and 34 are mounted in each end at a forward angle so they direct sound forwardly into the passenger compartment of the vehicle. The sound bar can be coordinated with the interior decor of the vehicle, utilizes unused space of the vehicle, projects sounds more directly at the vehicle occupants, and enables tuning to achieve improved sound quality.

6 Claims, 2 Drawing Sheets

SOUND BAR ASSEMBLY FOR MOTOR VEHICLES

BACKGROUND OF THE INVENTION

This invention relates to loudspeaker systems intended for use in motor vehicles and particularly to a sound bar assembly that can be mounted against the roof of the vehicle. The sound bar assembly contains chambers and other structure to enhance the quality of the sound and improve the aesthetic appearance of the vehicle interior.

For many years loudspeaker systems for motor vehicles consisted of speakers mounted in the instrument panel where they directed sound against the windshield. These systems relied on the windshield to direct the sound to the vehicle occupants. Speakers similarly were mounted in the package shelf behind the rear seat of the vehicle where they directed sound against the rear window of the vehicle and relied on the rear window to direct sound to the occupants.

Technical progress resulted in mounting speakers in the front doors of the vehicle. This location utilized space more effectively and enabled aiming the sound somewhat more directly at the vehicle occupants. Rear speakers were located in the rear doors or in the sides of the rear utility area of utility vehicles. While these arrangements resulted in improved sound quality, other hardware in the doors required mounting the speakers in the lower portions of the doors where the sound was directed more at the legs, and only indirectly at the ears, of the occupants. Speakers in the utility area of utility vehicles frequently were covered by articles being transported by the vehicle that distorted, muffled, or even blocked the sound completely.

An early expression of technology for mounting speakers against the roof of the vehicle appeared in 1939 with U.S. Pat. No. Little 2,165,637. Several additional patents on individual overhead speakers issued in the '70s to Okamoto et al. U.S. Pat. No. 4,005,761 and Okamoto et al. U.S. Pat. No. 4,056,165. Auto makers did not begin to appreciate the advantages of these speaker locations until the '80s when sound bar assemblies that extended across the roof of the vehicle and that included two or more speakers began to appear in the patent art and in motor vehicles. Several recent inventions in sound bar assemblies are shown in US Pat. Nos. Koppelomaki 4,673,056, Rosen 5,094,316, and Bahm et al. 5,606,623.

SUMMARY OF THE INVENTION

This invention provides a sound bar assembly that can be located within a motor vehicle for the purpose of converting electronic signals into sounds for the use of the occupants of the motor vehicle. The sound bar assembly coordinates with and enhances the interior decor of the vehicle, utilizes unused space of the vehicle, projects sounds more directly at the vehicle occupants, and enables tuning to achieve improved sound quality within limits imposed by the structure of the vehicle. The sound bar assembly comprises an upper member suitable for location adjacent the inside surface of the roof of the vehicle and adjacent an edge of the roof. The upper member has a length approximately corresponding to the width of the roof. A lower member is located adjacent the upper member and has its edges in a sealed relationship with the upper member to form a chamber with the upper member. The lower member has at least one opening, and a speaker assembly is mounted in the opening and is located within the chamber.

The sound bar assembly is particularly suited for mounting at the rear edge of the roof of the vehicle. In this construction, the sound bar assembly has a molding portion extending laterally along a longitudinal edge that is shaped and configured to conform aesthetically with other moldings of the interior of the vehicle. The molding portion preferably is integral with the lower member and also is shaped and configured to conform with the rearward structure of the vehicle roof so that it covers the rearward structure and blends aesthetically with other moldings of the interior of the vehicle.

The sound bar assembly preferably has a wedge-shaped cross-section with a narrow front portion and a wide rear portion. This enables mounting the speaker assemblies at a forward angle so that they project sound more directly into the passenger compartment.

The lower member preferably has a speaker assembly near each end to provide sound generation at the sides of the vehicle and the resulting sound separation. Speaker assemblies capable of bass and mid-range sounds are mounted in the lower member so that each speaker assembly is located within its own chamber. Sound from these bass and mid-range speakers reach the ears of the vehicle occupants in relatively undistorted form.

Additional openings can be formed in the lower or upper member for speaker assemblies capable of generating high range sounds (tweeters). Best sound quality is obtained by locating these tweeter assemblies so they project sounds directly at the passengers. The openings for the tweeter assemblies preferably are located in forwardfacing surfaces of either the lower or upper members. For enhanced space utilization, these tweeter openings are outboard of the bass and mid-range speaker assemblies.

Each speaker assembly capable of generating bass and midrange sounds is located within its own separate chamber. These chambers are formed by molding divider walls in one or both of the lower and upper members. A separate chamber for each speaker assembly enables improved sound quality.

Each chamber is designed so its shape and its size enhance the sound capabilities of its particular speaker assembly and the particular vehicle environment. Each vehicle environment, and each vehicle design, form a unique combination in which enhancement or suppression of certain sound frequencies is desired. In practice, the process of developing a sound bar assembly consists of mapping the vehicle to determine the frequency modes that need enhancement or suppression, selecting a speaker with desirable size and sound characteristics, and designing the size and shape of the chambers to take advantage of or correct targeted frequency modes.

The lower member and the upper member of the sound bar assembly preferably are made of polycarbonate, ABS, or S-RIM materials. These materials can be molded and formed to the tolerances necessary for proper sealing and air containment without the need for additional gasketing materials. The lower and upper members also can be fabricated of sheet metal if desired.

BRIEF DESCRIPTION OF THE DRAWINGS

FIG. 3 is taken through the midrange and bass speaker while FIG. 4 is taken at a more intermediate location.

DETAILED DESCRIPTION

Figure 1:
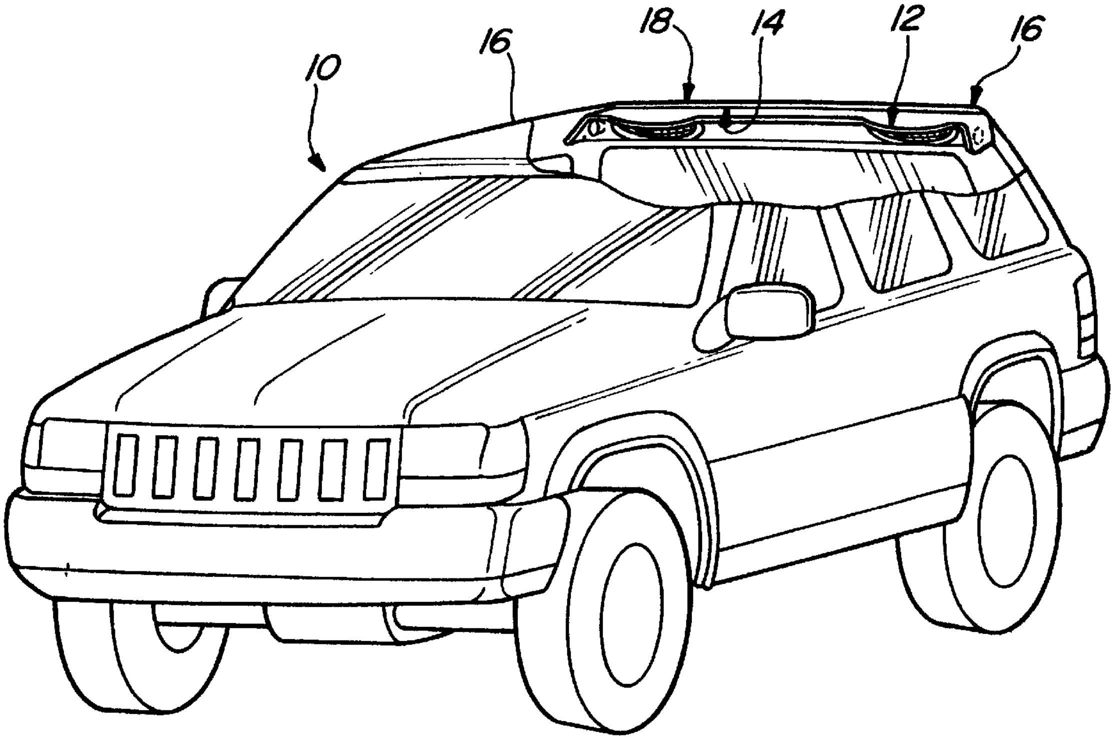
FIG. 1 is a perspective view of a sport utility vehicle with a sound bar assembly of this invention in place along the rearward portion of the vehicle roof. A portion of the vehicle roof is cut away to show the sound bar assembly.

Referring to FIG. 1, a sport utility vehicle 10 has a sound bar assembly 12 mounted against the inside surface 14 of the vehicle roof 16. The sound bar assembly is located at the rear edge 18 of the roof and extends laterally across the entire width of the rear edge of the vehicle roof.

Figure 2:
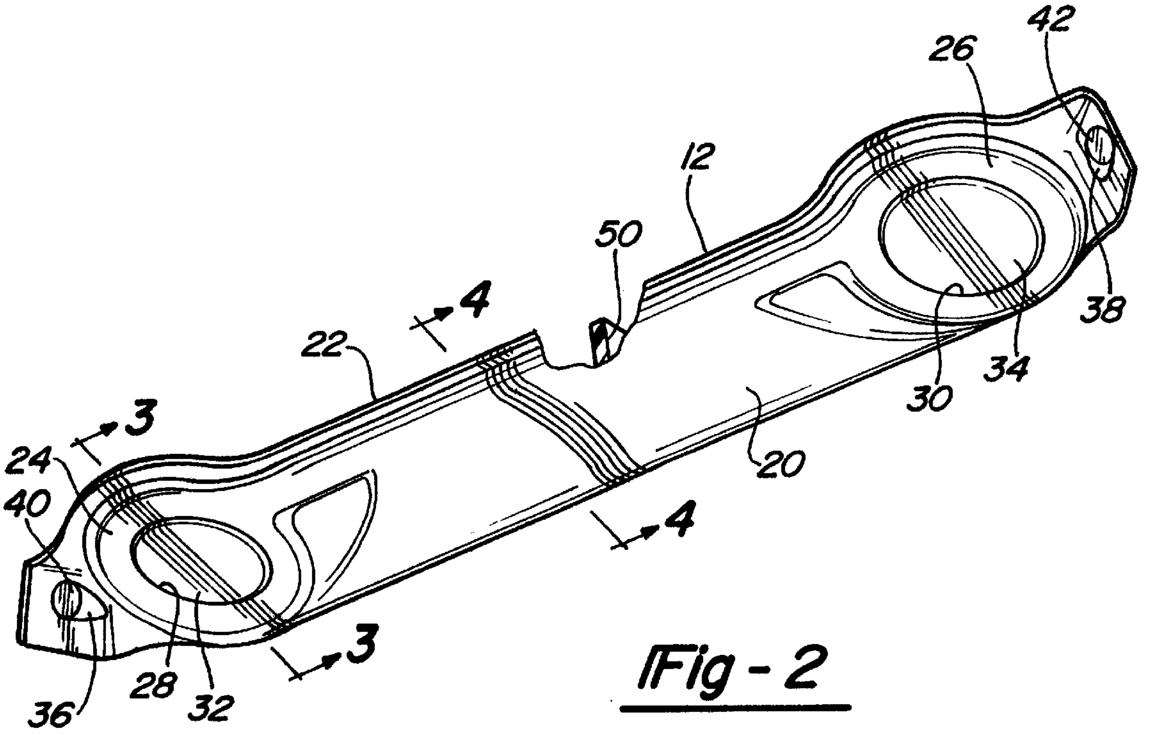
FIG. 2 is a perspective of the sound bar assembly itself that primarily shows the lower member with larger openings for the midrange and bass speakers and smaller openings for tweeters.
Figure 4:
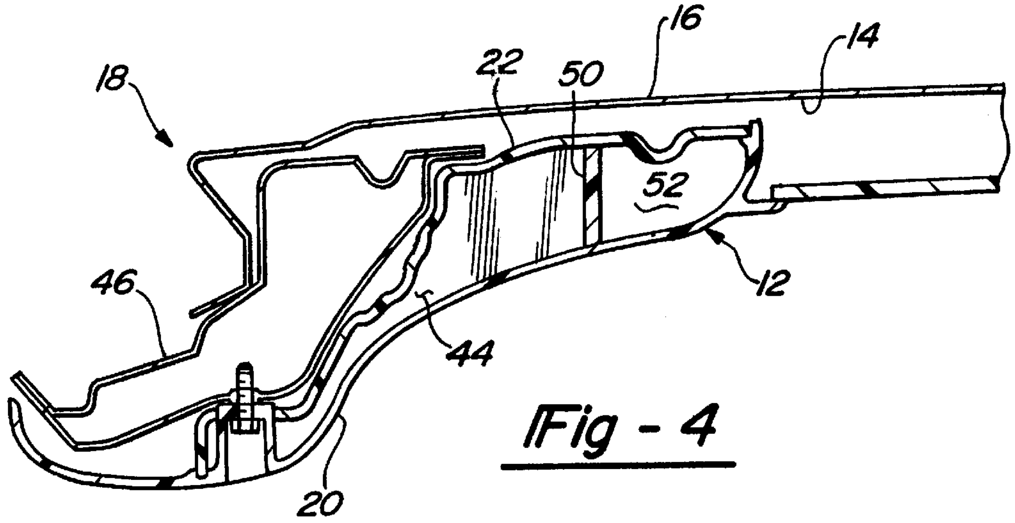
FIGS. 3 and 4 are cross-sections taken along lines 3—3 and 4—4 respectively of FIG. 2. Both show the lower and upper members and the molding portion of the sound bar assembly.

As shown in FIG. 2, sound bar assembly 12 consists of a lower member 20 and an upper member 22. Lower member 20 has enlarged and widened end portions 24 and 26, and the end portions contain downwardly and forwardly facing openings 28 and 30 that accept bass/midrange speakers 32 and 34. Openings 28 and 30 are angled forward so speakers 32 and 34 project sounds both downward and forward into the passenger compartment of the vehicle.

Smaller openings 36 and 38 are formed in lower member 20 outboard of openings 28 and 30. These smaller openings face more forward than downward, and higher range speaker assemblies 40 and 42, typically those capable of generating sounds of higher frequencies and known in the trade as tweeters, are mounted in openings 36 and 38.

Figure 3:
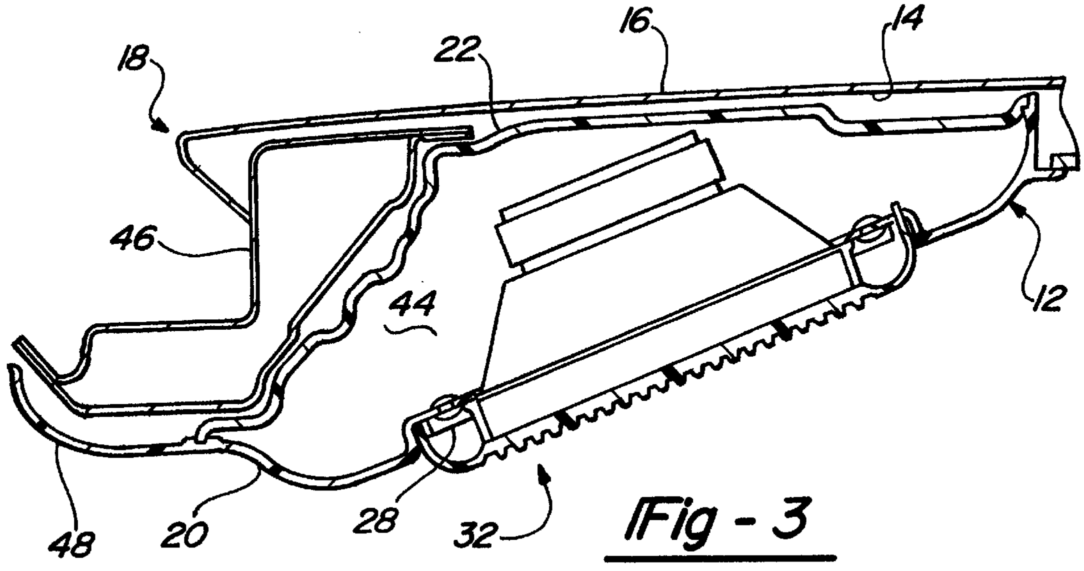

As shown more clearly in FIG. 3, the edges of the lower member 20 and upper member 22 fit together in a sealed relationship and define an internal chamber 44. Upper member 22 is shaped to conform essentially to the rearward portion of vehicle roof 16 and to the structural members indicated generally by numeral 46 that form the rear edge of the vehicle roof. Lower member 20 has a bass/midrange speaker 32 mounted in its opening 28 so that the speaker is located in chamber 44 and is essentially sealed to lower member 20.

Lower member 20 has a molding portion 48 that projects beyond the junction of the lower and upper members. Molding portion 48 extends for the entire length of lower member 20 and covers the lower portions of structural members 46 from view when the sound bar assembly is in place in the vehicle. Molding portion 48 is formed to provide an esthetic appearance that is consistent with other internal moldings of the trim package of the vehicle interior.

FIG. 3 also illustrates the wedge shape of the preferred sound bar assembly. This shape is achieved by having a generally narrow forward dimension and a generally wider rearward dimension for the sound bar assembly. The resulting sound bar assembly maximizes usage of the space at the rear surface of the roof of a vehicle and enables mounting the speakers at a forward angle so they direct sound forwardly into the passenger compartment.

The upper and lower members of the sound bar assembly provide separate chambers for each bass/midrange speaker assembly. This is accomplished by forming an intermediate wall 50 in the upper and/or lower members as appropriate. Wall 50 extends laterally through the interior of the sound bar assembly and separates chamber 44 from a similar chamber 52. Chamber 44 contains the speaker assembly on the passenger side of the sound bar assembly (speaker 32 in FIG. 2), and chamber 52 contains the speaker assembly on the driver side of the sound bar assembly (speaker 34 in FIG. 2).

Chambers 44 and 52 are sized and shaped to adapt the sound bar assembly to its environment by enhancing or suppressing certain frequencies. Enhancement of sounds of lower frequencies generally is desired in vehicle installations, and larger chambers are used to enhance those frequencies. Accordingly chambers 44 and 52 are made as large as possible consistently with the space available in the vehicle.

Any of various fasteners used in the automotive industry can be used to attach the sound bar assembly to the vehicle roof. The forward portion of the sound bar assembly preferably is attached to the headliner 54 of the vehicle. Alternative constructions of installing the sound bar assembly against the headliner or of covering the sound bar assembly with the headliner also can be achieved.

A sport utility vehicle is selected for the detailed description as it is a popular application of sound bar assemblies of the type of this invention. The sound bar assembly also can be applied to passenger cars and the cabs of light, medium, and heavy trucks. Each application requires tuning of the chambers to the desired size and shape to enhance the quality of the sound produced by the sound bar assembly.

I claim:

1. A sound bar assembly suitable for location within a motor vehicle for the purpose of converting electronic signals into sounds for the use of the occupants of the motor vehicle comprising:

an elongated upper member (22) suitable for location adjacent the inside surface of the roof (16) of the vehicle and adjacent an edge of the roof, said upper member having a length approximately corresponding to the width of the roof, a lower member (20) located adjacent the upper member and having its edges in a sealed relationship with the upper member to form a chamber (44) with the upper member, said lower member having at least one opening (28) for mounting a speaker assembly within the chamber, said lower member having a molding portion (48) extending laterally along an edge and shaped and configured to conform aesthetically with other moldings of the interior of the vehicle, and a speaker assembly (32) mounted in the opening of the lower member and located within the chamber.

2. The sound bar assembly of claim 1 comprising a wall (50) between the upper member and the lower member that forms the interior of the sound bar assembly into a first chamber (44) and a second chamber (52), said speaker assembly (32) being located in the first chamber, and a second speaker assembly (34) mounted in a second opening (30) of the lower member and located within the second chamber.

3. The sound bar assembly of claim 2 in which the upper member and the lower member are made of polycarbonate, ABS, or S-RIM materials.

4. The sound bar assembly of claim 3 suitable for location at the rear edge of the roof of a vehicle and having a narrow front portion and a wider rear portion, said speaker assemblies being mounted at a forward angle so they direct sounds downwardly and forwardly into the passenger compartment of the vehicle.

5. The sound bar assembly of claim 1 in which the upper member and the lower member are made of polycarbonate, ABS, or S-RIM materials.

6. The sound bar assembly of claim 1 suitable for location at the rear edge of the roof of a vehicle and having a narrow front portion and a wider rear portion, said speaker assemblies being mounted at a forward angle so they direct sounds downwardly and forwardly into the passenger compartment of the vehicle.

* * * * *